United States Patent
Osame et al.

(10) Patent No.: US 9,093,571 B2
(45) Date of Patent: Jul. 28, 2015

(54) DISPLAY DEVICE AND ELECTRONIC DEVICE USING THE SAME

(71) Applicant: Semiconductor Energy Laboratory Co., Ltd., Atsugi-shi, Kanagawa-ken (JP)

(72) Inventors: Mitsuaki Osame, Kanagawa (JP); Taichi Kato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 46 days.

(21) Appl. No.: 13/681,556

(22) Filed: Nov. 20, 2012

(65) Prior Publication Data

US 2013/0075738 A1    Mar. 28, 2013

Related U.S. Application Data

(60) Continuation of application No. 12/561,295, filed on Sep. 17, 2009, now Pat. No. 8,325,167, which is a division of application No. 11/279,702, filed on Apr. 13, 2006, now Pat. No. 7,595,778.

(30) Foreign Application Priority Data

Apr. 15, 2005 (JP) ................................. 2005-118813

(51) Int. Cl.
   *H01L 33/00* (2010.01)
   *G09G 3/32* (2006.01)

(52) U.S. Cl.
   CPC .......... *H01L 33/0041* (2013.01); *G09G 3/3258* (2013.01); *G09G 3/3291* (2013.01); *G09G 2300/0819* (2013.01); *G09G 2300/0847* (2013.01); *G09G 2310/0251* (2013.01); *G09G 2320/0238* (2013.01); *H01L 2924/0002* (2013.01)

(58) Field of Classification Search
   CPC . H01L 33/0041; G09G 3/3291; G09G 3/3258
   USPC ............ 345/82, 204, 214, 76–77; 315/169.1, 315/169.3
   See application file for complete search history.

(56) References Cited

U.S. PATENT DOCUMENTS

| 6,518,962 B2 * | 2/2003 | Kimura et al. ................ 345/211 |
| 6,542,138 B1 * | 4/2003 | Shannon et al. ................ 345/76 |
| 6,661,397 B2 * | 12/2003 | Mikami et al. ................. 345/76 |

(Continued)

FOREIGN PATENT DOCUMENTS

| EP | 0923067 A1 | 6/1999 |
| EP | 1103946 A2 | 5/2001 |

(Continued)

*Primary Examiner* — Matthew Fry
(74) *Attorney, Agent, or Firm* — Fish & Richardson P.C.

(57) ABSTRACT

A display device with a compensation circuit that applies a fixed potential constantly to a gate electrode of a driving transistor for a certain period is provided. Specifically, each difference voltage value between an anode and a cathode of the light emitting element is utilized in the case where the light emitting element emits light and emits no light. In a case where the light emitting element emits light, a potential of the gate electrode of the driving transistor is to be held; and in a case where the light emitting element emits no light, a potential that certainly turns off the gate electrode of the driving transistor is kept on applying to the gate electrode of the driving transistor.

22 Claims, 12 Drawing Sheets

(56) References Cited

U.S. PATENT DOCUMENTS

| | | | |
|---|---|---|---|
| 6,693,610 B2 * | 2/2004 | Shannon et al. | 345/76 |
| 6,774,877 B2 | 8/2004 | Nishitoba et al. | |
| 6,781,567 B2 | 8/2004 | Kimura | |
| 6,897,838 B2 | 5/2005 | Okamoto | |
| 6,958,750 B2 | 10/2005 | Azami et al. | |
| 7,057,587 B2 | 6/2006 | Numao | |
| 7,088,052 B2 | 8/2006 | Kimura | |
| 7,187,133 B2 * | 3/2007 | Oh | 315/169.3 |
| 7,268,760 B2 | 9/2007 | Mikami et al. | |
| 7,362,322 B2 * | 4/2008 | Kimura et al. | 345/211 |
| 7,429,985 B2 | 9/2008 | Kimura et al. | |
| 7,928,945 B2 | 4/2011 | Kimura et al. | |
| 8,325,167 B2 * | 12/2012 | Osame et al. | 345/204 |
| 2002/0000576 A1 | 1/2002 | Inukai | |
| 2002/0153844 A1 | 10/2002 | Koyama | |
| 2003/0011584 A1 | 1/2003 | Azami et al. | |
| 2003/0071772 A1 | 4/2003 | Kimura | |
| 2003/0107535 A1 * | 6/2003 | Numao | 345/76 |
| 2003/0122747 A1 * | 7/2003 | Shannon et al. | 345/76 |
| 2003/0214245 A1 | 11/2003 | Yamazaki et al. | |
| 2004/0090434 A1 | 5/2004 | Miyazawa | |
| 2004/0100427 A1 | 5/2004 | Miyazawa | |
| 2004/0113159 A1 * | 6/2004 | Burns et al. | 257/82 |
| 2004/0189214 A1 | 9/2004 | Osame et al. | |
| 2004/0251953 A1 * | 12/2004 | Yamazaki et al. | 327/512 |
| 2004/0252565 A1 * | 12/2004 | Yamazaki et al. | 365/202 |
| 2004/0263741 A1 * | 12/2004 | Koyama et al. | 349/139 |
| 2005/0030265 A1 | 2/2005 | Miyagawa | |
| 2005/0052367 A1 | 3/2005 | Miyazawa | |
| 2005/0116907 A1 | 6/2005 | Miyazawa | |
| 2005/0168415 A1 | 8/2005 | Noda et al. | |
| 2005/0179628 A1 | 8/2005 | Kimura | |
| 2005/0248516 A1 * | 11/2005 | Li | 345/82 |
| 2005/0264472 A1 * | 12/2005 | Rast | 345/30 |
| 2006/0082528 A1 * | 4/2006 | Guo et al. | 345/82 |
| 2006/0238135 A1 * | 10/2006 | Kimura | 315/169.3 |
| 2006/0244699 A1 * | 11/2006 | Yamazaki | 345/82 |
| 2007/0035488 A1 | 2/2007 | Kimura | |
| 2007/0126664 A1 * | 6/2007 | Kimura | 345/76 |
| 2007/0152921 A1 | 7/2007 | Osame | |
| 2011/0186852 A1 | 8/2011 | Kimura et al. | |

FOREIGN PATENT DOCUMENTS

| | | |
|---|---|---|
| EP | 1193678 A2 | 4/2002 |
| EP | 1246157 A2 | 10/2002 |
| JP | 2002-175048 A | 6/2002 |
| JP | 2002-287695 A | 10/2002 |
| JP | 2002-297095 A | 10/2002 |
| JP | 2003-084733 A | 3/2003 |
| JP | 2003-509728 A | 3/2003 |
| JP | 2003195813 A | 7/2003 |
| JP | 2004-038209 A | 2/2004 |
| JP | 2004341312 A | 12/2004 |
| WO | WO 01/20591 A1 | 3/2001 |

* cited by examiner

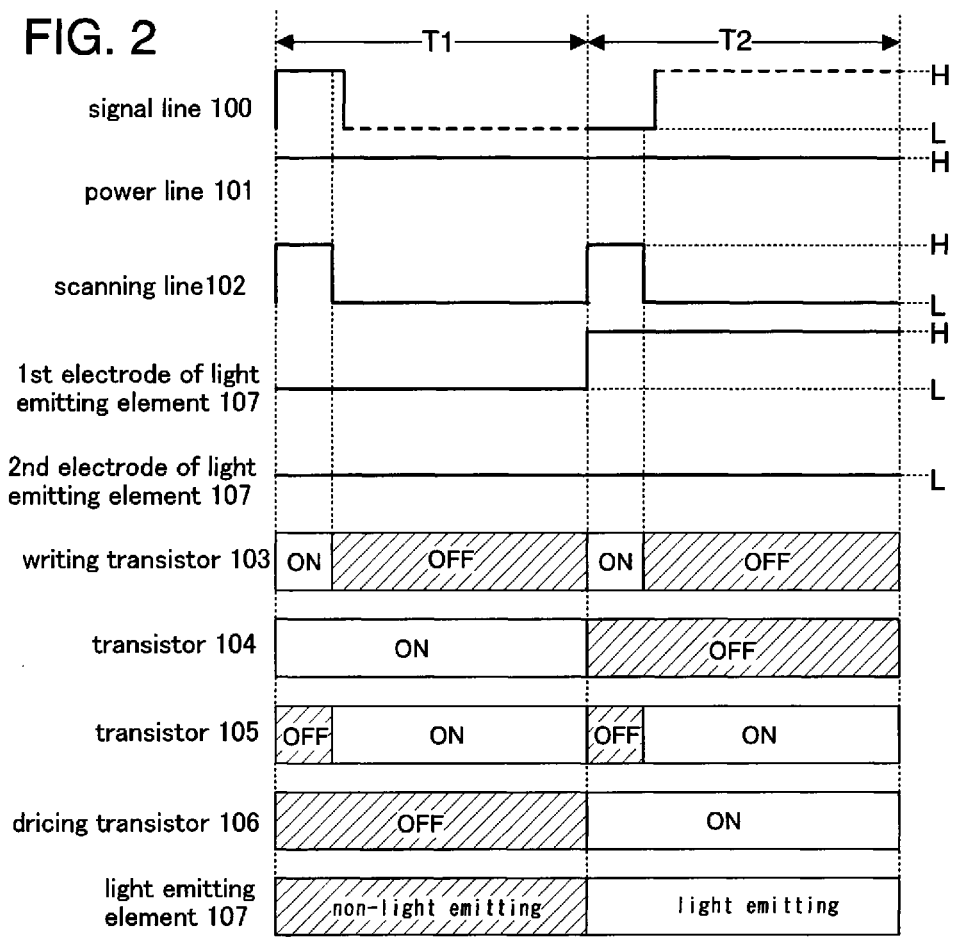

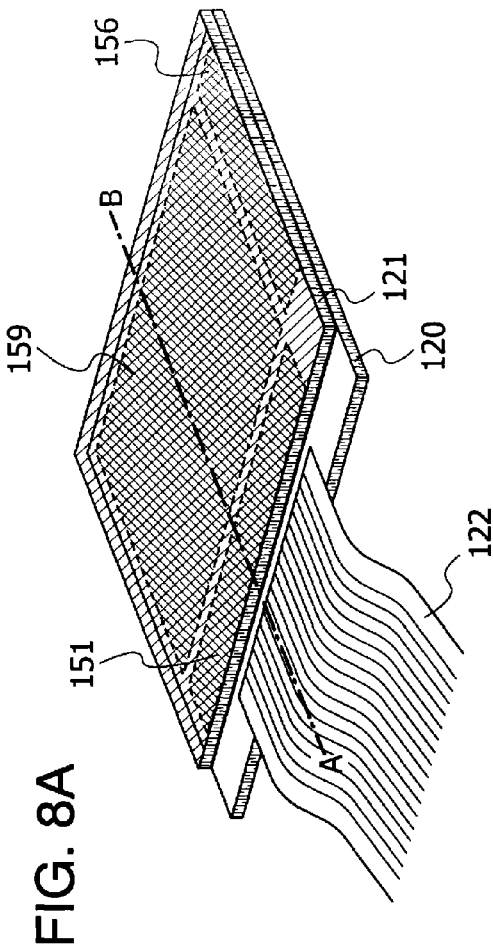
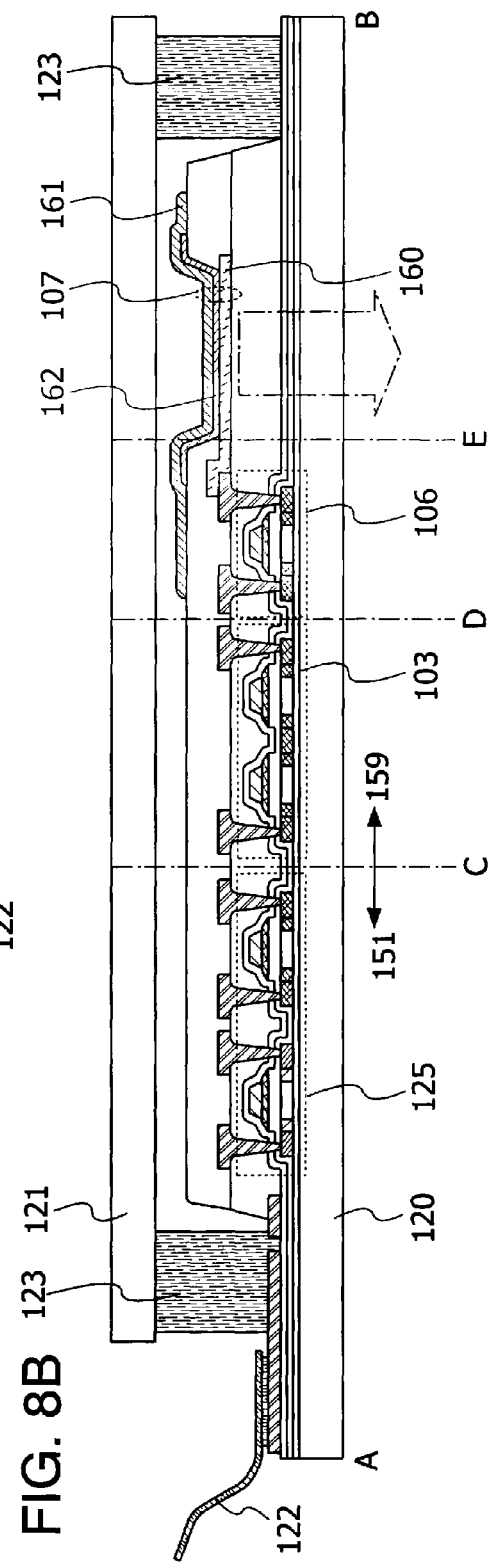
FIG. 8A
FIG. 8B

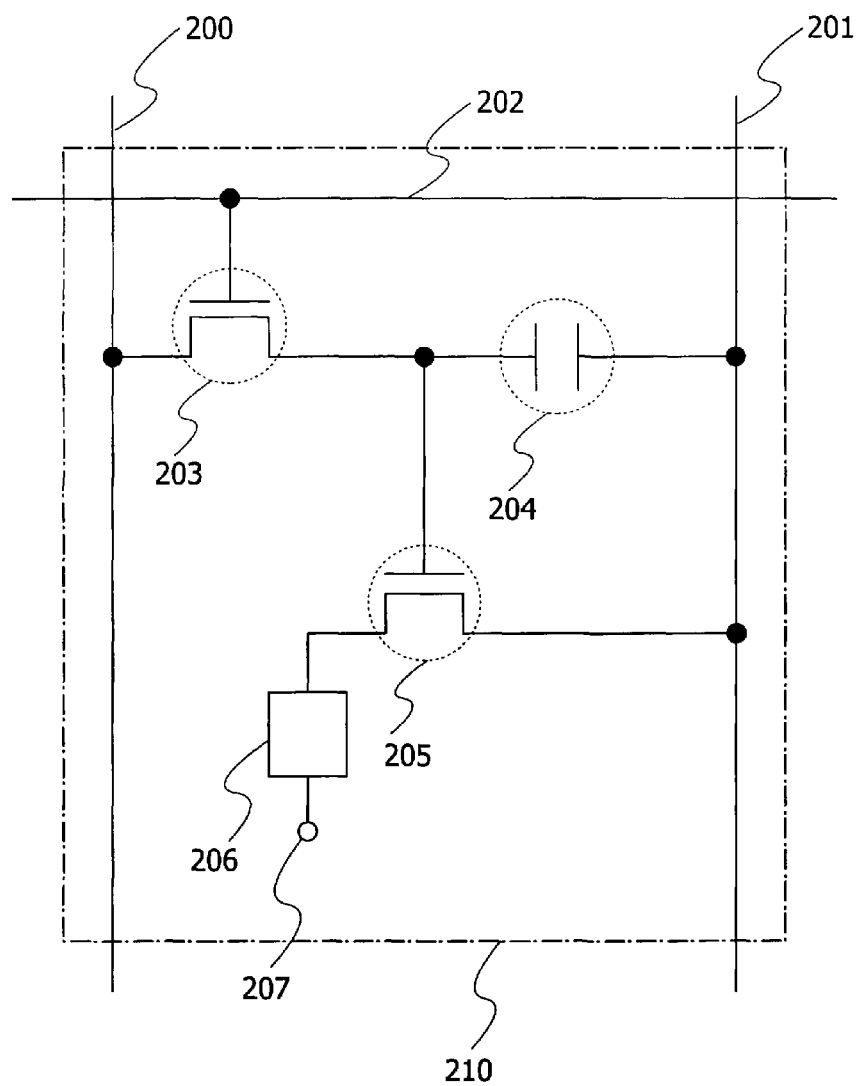

DISPLAY DEVICE AND ELECTRONIC DEVICE USING THE SAME

CROSS-REFERENCE TO RELATED APPLICATIONS

This application is a continuation of U.S. application Ser. No. 12/561,295, filed Sep. 17, 2009, now allowed, which is a divisional of U.S. application Ser. No. 11/279,702, filed Apr. 13, 2006, now U.S. Pat. No. 7,595,778, which claims the benefit of a foreign priority application filed in Japan as Serial No. 2005-118813 on Apr. 15, 2005, all of which are incorporated by reference.

BACKGROUND OF THE INVENTION

1. Field of the Invention

The present invention relates to a display device using a light emitting element. Specifically, the present invention relates to an active-matrix type display device including a plurality of pixels that are arranged in matrix where each of the plurality pixels includes a light emitting element. Further, the present invention also relates to an electronic device using the display device.

2. Description of the Related Art

In recent years, a display device using a self-light emitting element has been actively researched and developed. Especially, a display device using a light emitting element typified as an electro luminescence (EL) element has been actively researched and developed for practical application of use of a display.

In the case of displaying a multi-gray scale image by a display device using a light emitting element, a driving method of an analog driving method (an analog gray scale method) or a digital driving method (a digital gray scale method) is employed. The analog driving method is a method in which current magnitude flowing in a light emitting element is continuously controlled to obtain a gray scale. The digital driving method is a method in which a light emitting element is operated by using only two states of an ON state (where the luminance is approximately 100% and the light emitting element emits light) and an OFF state (where the luminance is approximately 0% and the light emitting element emits no light).

As the digital driving method without modification, the light emitting element can display only two gray scales because the light emitting element is operated by using only two states of the ON state and the OFF state. Therefore, a method, which is combined with a driving method displaying a multi-gray scale such as an area gray scale method and a time gray scale method, is employed. The area gray scale method is a method in which a gray scale display is performed depending on the size of a light emitting area of a sub-pixel by providing the sub-pixel in a pixel (for example, see Patent Document 1). Further, the time gray scale method is a method in which a gray scale is displayed by controlling a light-emitting period and frequency of light emission of a pixel (for example, see Patent Document 2 and Patent Document 3).

[Patent Document 1] Japanese Patent Application Laid-Open No. H11-73158

[Patent Document 2] Japanese Patent Application Laid-Open No. 2001-5426

[Patent Document 3] Japanese Patent Application Laid-Open No. 2001-343933

A configuration example of a pixel in a display device employing the digital driving method and operation thereof will be described below. Note that it is difficult to define a source electrode and a drain electrode of a thin film transistor over a substrate having an insulated surface due to a structure thereof. Accordingly, hereinafter, one of a source electrode and a drain electrode is represented as a first electrode, and then, the other of the source electrode and the drain electrode is represented as a second electrode except for a case where a definition of a source electrode and a drain electrode is particularly needed. In general, a lower potential side is a source electrode and a higher potential side is a drain electrode in an N-channel transistor, whereas a higher potential side is a source electrode and a lower potential side is a drain electrode in a P-channel transistor.

A pixel 210 includes a writing transistor 203, a driving transistor 205, and a light emitting element 206 (see FIG. 12). In the writing transistor 203, a gate electrode, a first electrode, and a second electrode are respectively connected to a scanning line 202, a signal line 200, and a gate electrode of the driving transistor 205. In the driving transistor 205, a first electrode and a second electrode are respectively connected to a power source line 201, and a first electrode of the light emitting element 206. A second electrode of the light emitting element 206 is connected to a power source 207. In the light emitting element 206, a structure in which the first electrode is an anode and the second electrode is a cathode, or a structure in which the anode and the cathode are reversed may be employed. In this case, a current direction is changed; therefore, each potential of the power source line 201 and the power source 207 are appropriately determined.

A capacitor 204 is provided to hold voltage between the gate electrode and the source electrode of the driving transistor 205 (hereinafter, referred to as Vgs). The capacitor 204 may be provided between the gate electrode of the driving transistor 205 and the power source line 201; or between the gate electrode of the driving transistor 205 and a wiring that is held at a fixed potential. Alternatively, the capacitor 204 for holding the voltage between the gate electrode and the source electrode of the driving transistor 205 is not provided, and instead, a parasitic capacitance that parasitizes between the gate electrode and the source electrode of the driving transistor 205 may be used in order to hold the Vgs of the driving transistor 205.

The power source line 201 and the power source 207 are held at each predetermined potential, which have a potential difference in each other. The power source line 201 is held at a fixed potential. The second electrode of the light emitting element 206 that is connected to the power source 207 is held at a fixed potential.

When the writing transistor 203 is turned on by a signal inputted through the scanning line 202, a video signal is inputted into the gate electrode of the driving transistor 205 through the signal line 200. A potential difference between the video signal and the power source line 201 is to be the Vgs of the driving transistor 205. When the driving transistor 205 is turned on by value of the Vgs, current is supplied to the light emitting element 206, and the light emitting element 206 emits light. On the other hand, when the driving transistor 205 is turned off by value of the Vgs, current is not supplied to the light emitting element 206, and the light emitting element 206 emits no light. The Vgs of the driving transistor 205 is held by the capacitor 204 for a certain period until a next video signal is inputted into the pixel 210.

SUMMARY OF THE INVENTION

Light emission and non-light emission of the light emitting element 206 is determined depending on turning on and off of the driving transistor 205. Accordingly, it is requires that the Vgs of the driving transistor 205 is a potential by which the driving transistor 205 is certainly turned on and off. Further, it is required that the Vgs of the driving transistor 205 is held so as not to vary for a certain period.

The capacitor 204 is provided to hold the Vgs of the driving transistor 205. However, when miniaturization of the pixel 210 with high definition proceeds, it has been difficult to secure an area for forming a capacitor that holds a sufficient amount of charge. There has been a case where the Vgs of the driving transistor 205 is held by using parasitic capacitance of the driving transistor 205 because the area for providing the capacitor 204 cannot be secured depending on the degree of miniaturization of the pixel 210.

When capacitance value of the capacitor 204 is insufficient or a leakage current is generated in the writing transistor 203, there has been a case where a potential of the gate electrode of the driving transistor 205 varies gradually. In particular, when the pixel 210 displays black color, there has been a case where the driving transistor 205 is not completely turned off by a little variation in a potential of the gate electrode of the driving transistor 205, and a small amount of current flows in the light emitting element 206 to generate slight light emission (hereinafter, referred to as black float) in the light emitting element 206. The black float is a display defect, which is easily recognized, and has been a big problem.

In the view of the above condition, it is an object of the present invention to provide a display device and an electronic device, which can control light emission and non-light emission of a light emitting element more precisely. Further, it is also an object of the present invention to provide a display device and an electronic device, which can make a driving transistor turn on and off certainly in order to control light emission and non-light emission of a light emitting element more precisely.

The present invention provides a display device with a compensation circuit that applies a fixed potential constantly to a gate electrode of a driving transistor for a certain period. By providing the compensation circuit, variation in a potential of the gate electrode of the driving transistor can be prevented. Accordingly, in the case of black display particularly, generation of black float that is easily to be recognized as a display defect is suppressed, and light emission and non-light emission of the light emitting element are controlled more precisely.

Specifically, each voltage value between an anode and a cathode of the light emitting element is deferent in the case where the light emitting element emits light and emits no light. By utilizing the voltage value at this time, the present invention provides a display device as follows. In the display device, in the case where the light emitting element emits light, a potential of the gate electrode of the driving transistor is to be held; and in the case where the light emitting element emits no light, a potential that certainly turns off the driving transistor can be applied to the gate electrode of the driving transistor.

A display device of the present invention includes a plurality of pixels, each of which includes a first transistor, a second transistor (corresponding to a driving transistor), a light emitting element, and a circuit that controls conduction between a gate electrode of the second transistor and a power source line (corresponding to a compensation circuit).

In a display device having the above structure, in the first transistor, a gate electrode; one of a source electrode and a drain electrode; and the other of the source electrode and the drain electrode are electrically connected to a scanning line; a signal line; and the gate electrode of the second transistor, respectively. In the second transistor, one of a source electrode and a drain electrode; and the other of the source electrode and the drain electrode are electrically connected to the power source line; and a first electrode of the light emitting element, respectively. In the light emitting element, a second electrode is held at a fixed potential. The circuit is to be in a conduction state or a non-conduction state depending on a potential of the first electrode of the light emitting element and a potential of the scanning line. A potential of the power source line is held to be different from the potential of the second electrode of the light emitting element.

A display device of the present invention includes a plurality of pixels, each of which includes a first transistor, a second transistor (corresponding to a driving transistor), a light emitting element, a circuit that controls conduction between a gate electrode of the second transistor and a power source line (corresponding to a compensation circuit), and a controlling element that controls conduction between the gate electrode of the second transistor and a second scanning line.

In a display device having the above structure, in the first transistor, a gate electrode; one of a source electrode and a drain electrode; and the other of the source electrode and the drain electrode are electrically connected to a first scanning line; a signal line; and the gate electrode of the second transistor, respectively. In the second transistor, one of a source electrode and a drain electrode; and the other of the source electrode and the drain electrode are electrically connected to a power source line; and a first electrode of the light emitting element, respectively. In the light emitting element, a second electrode is held at a fixed potential. The circuit is to be in a conduction state or a non-conduction state depending on a potential of the first electrode of the light emitting element and a potential of the first scanning line. The controlling element is to be in a conduction state or a non-conduction state based on a potential of a second scanning line. A potential of the power source line and the potential of the second scanning line are held to turn off the second transistor.

Further, in a display device having the above structure, in the first transistor, a gate electrode; one of a source electrode and a drain electrode; and the other of the source electrode and the drain electrode are electrically connected to a first scanning line; a signal line; and the gate electrode of the second transistor, respectively. In the second transistor, one of a source electrode and a drain electrode; and the other of the source electrode and the drain electrode are electrically connected to a power source line; and a first electrode of the light emitting element, respectively. In the light emitting element, a second electrode is held at a fixed potential. The circuit is to be in a conduction state or a non-conduction state depending on a potential of the first electrode of the light emitting element, a potential of the first scanning line, and a potential of a second scanning line. The controlling element is to be in a conduction state or a non-conduction state based on a potential of the second scanning line. A potential of the power source line and a potential of the second scanning line are held to turn off the second transistor.

A display device of the present invention includes a plurality of pixels, each of which includes a first transistor, a second transistor (corresponding to a driving transistor), a light emitting element, a circuit that controls conduction between a gate electrode of the second transistor and a power source line (corresponding to a compensation circuit), and a controlling element that controls conduction between one of a source electrode and a drain electrode of the second transistor and the power source line.

In a display device having the above structure, in the first transistor, a gate electrode; one of a source electrode and a drain electrode; and the other of the source electrode and the drain electrode are electrically connected to a first scanning line; a signal line; and the gate electrode of the second transistor, respectively. In the second transistor, one of the source electrode and the drain electrode; and the other of the source electrode and the drain electrode are electrically connected to the power source line through the controlling element; and a first electrode of the light emitting element, respectively. In the light emitting element, a second electrode is held at a fixed potential. The circuit is to be in a conduction state or a non-conduction state depending on a potential of the first electrode of the light emitting element and a potential of the first scanning line. The controlling element is to be in a conduction state or a non-conduction state depending on a potential of a second scanning line. A potential of the power source line is held to be different from a potential of the second electrode of the light emitting element.

A display device of the present invention includes a plurality of pixels, each of which includes a first transistor, a second transistor, a light emitting element, a third transistor, and a fourth transistor. In the first transistor, a gate electrode; one of a source electrode and a drain electrode; and the other of the source electrode and the drain electrode are electrically connected to a scanning line; a signal line; and a gate electrode of the second transistor and one of a source electrode and a drain electrode of the third transistor, respectively. In the second transistor, one of a source electrode and a drain electrode; and the other of the source electrode and the drain electrode are electrically connected to a power source line; and a first electrode of the light emitting element and a gate electrode of the third transistor. In the light emitting element, a second electrode is held at a fixed potential. In the third transistor, the other of the source electrode and the drain electrode is electrically connected to one of a source electrode and a drain electrode of the fourth transistor. In the fourth transistor, a gate electrode; and the other of the source electrode and the drain electrode are electrically connected to the scanning line; and the power source line, respectively. A potential of the power source line is held to turn off the second transistor.

A display device of the present invention includes a plurality of pixels, each of which includes a first transistor, a second transistor, a light emitting element, a third transistor, a fourth transistor, and a controlling element. In the first transistor, a gate electrode; one of a source electrode and a drain electrode; and the other of the source electrode and the drain electrode are electrically connected to a first scanning line; a signal line; and a gate electrode of the second transistor, one of a source electrode and a drain electrode of the third transistor, and one of terminals of the controlling element, respectively. In the second transistor, one of a source electrode and a drain electrode; and the other of the source electrode and the drain electrode are electrically connected to a power source line; and a first electrode of the light emitting element and a gate electrode of the third transistor, respectively. In the light emitting element, a second electrode is held at a fixed potential. In the third transistor, the other of the source electrode and the drain electrode is electrically connected to one of a source electrode and a drain electrode of the fourth transistor. In the fourth transistor, a gate electrode; and the other of the source electrode and the drain electrode are electrically connected to the first scanning line; and the power source line, respectively. In the controlling element, the other terminal is connected to a second scanning line. A potential of the power source line and a potential of the second scanning line are held to turn off the second transistor.

A display device of the present invention includes a plurality of pixels, each of which includes a first transistor, a second transistor, a light emitting element, a third transistor, a fourth transistor, a fifth transistor, and a controlling element. In the first transistor, a gate electrode; one of a source electrode and a drain electrode; and the other of the source electrode and the drain electrode are electrically connected to a first scanning line; a signal line; and a gate electrode of the second transistor and one of a source electrode and a drain electrode of the third transistor, respectively. In the second transistor, one of a source electrode and a drain electrode; and the other of the source electrode and the drain electrode are electrically connected to a power source line; and a first electrode of the light emitting element, a gate electrode of the third transistor, and one of terminals of the controlling element, respectively. In the light emitting element, a second electrode is held at a fixed potential. In the third transistor, the other of the source electrode and the drain electrode is electrically connected to one of a source electrode and a drain electrode of the fourth electrode. In the fourth transistor, a gate electrode; and the other of the source electrode and the drain electrode are electrically connected to the first scanning line; and one of a source electrode and a drain electrode of the fifth transistor, respectively. In the fifth transistor, the other of the source electrode and the drain electrode is electrically connected to the pour source line. In the controlling element, the other terminal is connected to a second scanning line. A potential of the power source line and a potential of the second scanning line are held to turn off the second transistor.

In a display device having the above structure, the controlling element is a diode. Further, in a display device having the above structure, the controlling element is a sixth transistor. One of terminals of the controlling element is a gate electrode and a drain electrode of the sixth transistor, and the other terminal of the controlling element is a source electrode of the sixth transistor. In addition, in a display device having the above structure, the first transistor, the second transistor, the light emitting element, the third transistor, the fourth transistor, the fifth transistor, and the sixth transistor are provided over a substrate having a same insulated surface. When the sixth transistor is used as a controlling element, first to fifth transistors included in a pixel and the sixth transistor can be manufactured in a same manufacturing process. Accordingly, by using the sixth transistor as a controlling element, a manufacturing process is not required to be added; therefore, a display device can be manufactured easily.

A display device of the present invention includes a plurality of pixels, each of which includes a first transistor, a second transistor, a light emitting element, a third transistor, a fourth transistor, and a fifth transistor. In the first transistor, a gate electrode; one of a source electrode and a drain electrode; and the other of the source electrode and the drain electrode are electrically connected to a first scanning line; a signal line; and a gate electrode of the second transistor and one of a source electrode and a drain electrode of the third transistor, respectively. In the second transistor, one of a source electrode and a drain electrode; and the other of the source electrode and the drain electrode are electrically connected to one of a source electrode and a drain electrode of the fifth transistor; and a first electrode of the light emitting element and a gate electrode of the third transistor, respectively. In the light emitting element, a second electrode is held at a fixed potential. In the third transistor, the other of the source electrode and the drain electrode is electrically connected to one of a source electrode and a drain electrode of the fourth transistor. In the fourth transistor, a gate electrode; and the other of the source electrode and the drain electrode are electrically connected to the first scanning line; and a power source line, respectively. In the fifth transistor, a gate electrode; and the other of the source electrode and the drain electrode are electrically connected to a second scanning line; and the power source line, respectively.

In a display device having the above structure, the controlling element is the fifth transistor. In the fifth transistor, a gate electrode; one of a source electrode and a drain electrode; and the other of the source electrode and the drain electrode are electrically connected to the second scanning line; the power source line; and one of a source electrode and a drain electrode of the second transistor, respectively.

In a display device having the above structure, the third transistor may be a transistor having a plurality of gate electrodes that are connected to each other. In other words, the third transistor may be replaced with a transistor having a plurality of gate electrodes that are connected to each other (also called a transistor of a multi-gate structure). By using the transistor having a plurality of gate electrodes that are connected to each other, a leakage current can be reduced.

In a display device having the above structure, polarity (also referred to as a conductivity type) of the first transistor and polarity of the fourth transistor are different each other.

In a display device of the present invention, a driving method, which can realize a multi-gray scale display with high precision by using a digital driving method and a digital time gray scale method, can be applied.

Further, an electronic device (a portable information terminal; a camera such as a digital camera, a video camera, and a digital video camera; a cellular phone unit; a portable television set; a computer such as a notebook computer; or the like) of the present invention uses a display device having any one of the above structures.

In accordance with the present invention, light emission and non-light emission of a light emitting element can be controlled more precisely by suppressing variation in a potential of a gate electrode of a driving transistor. Accordingly, generation of a display defect can be suppressed.

BRIEF DESCRIPTION OF DRAWINGS

FIG. 2 is a diagram showing a timing chart;

FIGS. 8A and 8B are views describing a display device of the present invention;

FIG. 12 is a diagram showing a configuration example of a pixel in a display device.

DETAILED DESCRIPTION OF THE INVENTION

Figure 1:
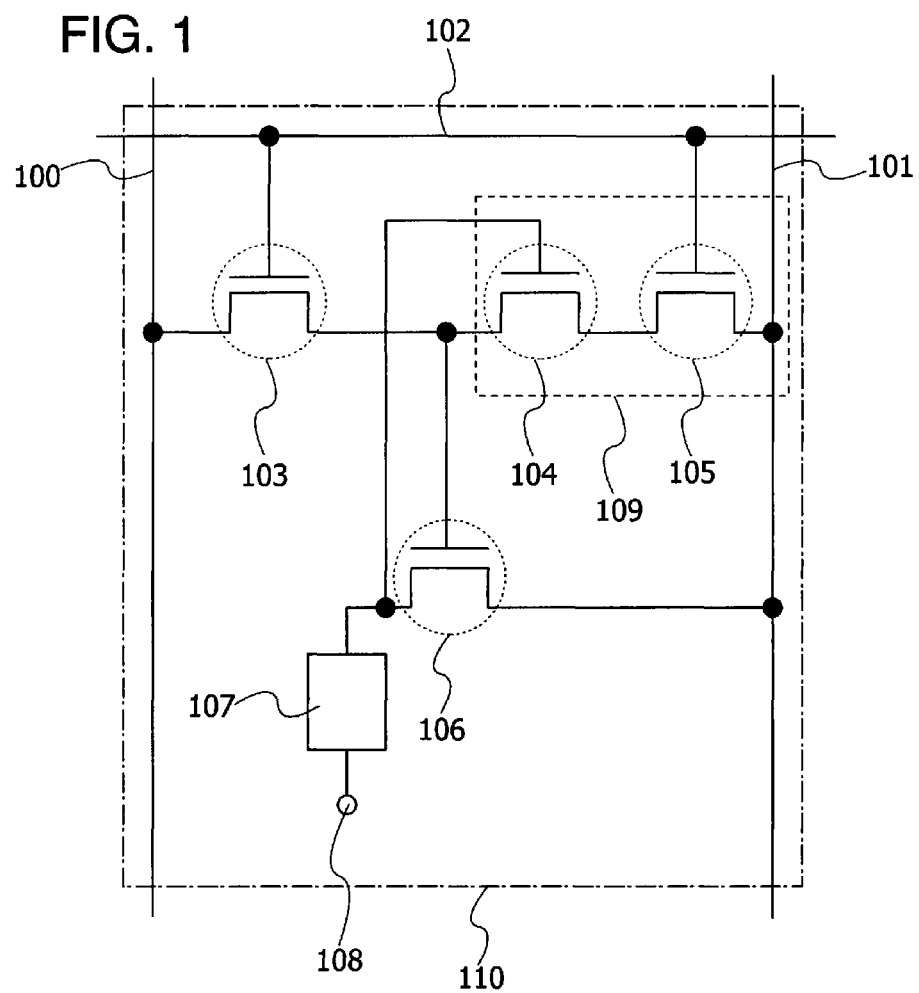
FIG. 1 is a diagram showing a configuration example of a pixel in a display device of the present invention.

Embodiment Modes of the present invention will be described in details with reference to the accompanying drawings. However, the present invention is not limited to the following description, and it is to be easily understood that various changes and modifications are possible by those skilled in the art, unless such changes and modifications depart from the content and the scope of the invention. Therefore, the present invention is not construed as being limited to the description of the following embodiment modes. It is to be noted that the same portion is denoted by the same reference numeral in different drawings in the following description.

(Embodiment Mode 1)

A configuration of a pixel in a display device of the present invention will be described with reference to FIG. 1.

A pixel 110 includes a writing transistor 103, a driving transistor 106, a light emitting element 107, and a circuit that controls conduction between a gate electrode of the driving transistor 106 and a power source line 101 (hereinafter, called a compensation circuit 109). The compensation circuit 109 includes a transistor 104 and a transistor 105 that are connected in series.

Further, the pixel 110 may include a capacitor that holds a potential of the gate electrode of the driving transistor 106. A first electrode of the capacitor is connected to the gate electrode of the driving transistor 106, and a second electrode of the capacitor is connected to a source electrode of the driving transistor 106 or a power source line that is held at a fixed potential. A case where the potential of the gate electrode of the driving transistor 106 is held by capacitance (parasitic capacitance) of the driving transistor 106 is described below.

In the writing transistor 103, a gate electrode; a first electrode (one of a source electrode and a drain electrode); and a second electrode (the other of the source electrode and the drain electrode) are connected to a scanning line 102; a signal line 100; and the gate electrode of the driving transistor 106 and a first electrode of the transistor 104, respectively. In the driving transistor 106, a first electrode (one of a source electrode and a drain electrode); and a second electrode (the other of the source electrode and the drain electrode) are connected to a first electrode of the light emitting element 107 and a gate electrode of the transistor 104; and the power source line 101, respectively. In the light emitting element 107, a second electrode is connected to a terminal 108 that is connected to a power source, and is held at a fixed potential.

In the transistor 104, the gate electrode; a first electrode (one of a source electrode and a drain electrode); and a second electrode (the other of the source electrode and the drain electrode) are connected to the first electrode of the light emitting element 107 and the first electrode of the driving transistor 106; the gate electrode of the driving transistor 106; and a first electrode of the transistor 105, respectively. In the transistor 105, a gate electrode; a first electrode (one of a source electrode and a drain electrode); and a second electrode (the other of the source electrode and the drain electrode) are connected to the scanning line 102; the second electrode of the transistor 104; and the power source line 101, respectively.

The light emitting element 107 may have a structure in which the first electrode is an anode and the second electrode is a cathode, or a structure in which the anode and the cathode are reversed. In that case, a current direction is changed; therefore, a potential of the power source 101 and a potential of the power source that is connected to the terminal 108 are appropriately determined.

Both the writing transistor 103 and the transistor 105 are connected to the scanning line 102. Polarity of the writing transistor 103 and polarity of the transistor 105 are different from each other. When the writing transistor 103 is turned on, the transistor 105 is turned off. Alternatively, when the writing transistor 103 is turned off, the transistor 105 is turned on.

If polarity of the writing transistor 103 and polarity of the transistor 105 are the same, a scanning line corresponding to each of the writing transistor 103 and the transistor 105 is provided.

Further, the transistor 104 has polarity, which is turned off when a potential of the power source connected to the terminal 108 is transmitted.

Next, operation of the pixel 110 will be described with the use of a timing chart (see FIG. 2). Hereinafter, the writing transistor 103 is to be an N-channel transistor, and each of the driving transistor 106, the transistor 104, and the transistor 105 is to be a P-channel transistor as an example. Further, as a potential of the power source line 101 is to be a standard, and each potential of the signal line 100 and the scanning line 102 is determined. In the signal line 100, a potential of a H level (high potential) side of a video signal is higher than that of the power source line 101, and a potential of a L level (low potential) side is a potential that certainly turns on the driving transistor 106 (for example, 0V). In the scanning line 102, a potential of a H level (high potential) side is higher than that of the signal line 100, which certainly turns on the writing transistor 103; and a potential of a L level (low potential) side is lower than that of the signal line 100, which certainly turns off the writing transistor 103. Each potential of the power source line 101 and a second electrode of the light emitting element 107 is held at a fixed potential.

It is to be noted that polarity of the above transistors and each power source potential add no limitation to the present invention. It is easy for those skilled in the art to configure an equivalent circuit by adding modification to polarity of a transistor and each power source potential in accordance with an art concept of the present invention, and it is clear that these structures are included in the present invention.

In a term T1, when the scanning line 102 is selected by a gate driver and a potential thereof becomes higher, the writing transistor 103 is turned on. In addition, a video signal is inputted from a source driver into the pixel 110 through the signal line 100. Then, a potential of the video signal is applied to a gate electrode of the driving transistor 106 through the writing transistor 103. Turning on and off of the driving transistor 106 is determined by a potential difference between the video signal and the power source line 101. In a case where the driving transistor 106 is turned on, the light emitting element 107 emits light by supplying current from the power source line 101 to the light emitting element 107. In a case where the driving transistor 106 is turned off, the light emitting element 107 emits no light. In the term T1, it is supposed that the driving transistor 106 is turned off due to the video signal inputted into the pixel 110.

When a selection of the scanning line 102 by the gate driver is finished and the potential of the scanning line 102 becomes lower, the writing transistor 103 is turned off. Until the scanning line 102 is selected again and a next video signal is inputted into the pixel 110, a potential of the gate electrode of the driving transistor 106 is held by the driving transistor 106.

In a case where the driving transistor 106 is turned off based on a video signal inputted into the pixel 110 and the light emitting element 107 emits no light, a potential of the first electrode of the light emitting element 107 becomes equal to or more than a potential of the power source line connected to the terminal 108, and equal to or less than a light-emitting starting potential of the light emitting element 107 defined as a potential when the light emitting element starts to emit light. Thus, the transistor 104 is turned on. Further, the transistor 105 is turned on in this case. Therefore, the gate electrode of the driving transistor 106 is connected to the power source line 101 through the transistor 104 and the transistor 105. As a result, a potential of the power source line 101 is transmitted to the gate electrode of the driving transistor 106, and then, the driving transistor 106 is certainly turned off.

In the case where the driving transistor 106 is turned off based on the video signal inputted into the pixel 110 in such a manner, the compensation circuit 109 is to be in a conduction state, and the gate electrode of the driving transistor 106 and the power source line 101 are made to be in a conduction state. Then, the potential of the power source line 101 is transmitted to the gate electrode of the driving transistor 106 so as to turn off the driving transistor 106 certainly. As a result, variation in the potential of the gate electrode of the driving transistor 106 can be prevented. It is to be noted that the transistor 104 included in the compensation circuit 109 is controlled based on a potential of the first electrode of the light emitting element 107. In addition, the transistor 105 included in the compensation circuit 109 is controlled by a potential of the scanning line 102. In such a manner, the present invention has a feature that the compensation circuit 109 is controlled by utilizing each potential of the first electrode of the light emitting element 107 and the scanning line 102 without providing an exclusive circuit for controlling the compensation circuit 109.

In a term T2, when the scanning line 102 is selected by the gate driver and the potential of the scanning line 102 becomes higher, the writing transistor 103 is turned on. Further, a video signal is inputted from the source driver into the pixel 110 through the signal line 100. In the term T2, it is supposed that the driving transistor 106 is turned on due to the video signal inputted into the pixel 110.

When the selection of the scanning line 102 by the gate driver is finished and the potential of the scanning line 102 becomes lower, the writing transistor 103 is turned off. Then, until a next video signal is inputted into the pixel 110, the potential of the gate electrode of the driving transistor 106 is held by the driving transistor 106.

In a case where the driving transistor 106 is turned on based on the video signal inputted into the pixel 110 and the light emitting element 107 emits light, a potential of the first electrode of the light emitting element 107 becomes the same potential or about the same potential as that of the power source line 101. Accordingly, the transistor 104 is turned off. Since the potential of the gate electrode of the driving transistor 106 is a lower potential, the driving transistor 106 is turned on.

When the light emitting element 107 emits light by turning on the driving transistor 106, its potential may be increased slightly because electric charge that is held in the gate electrode of the driving transistor 106 is leaked. However, it is hardly to be a problem because a current value that is supplied to the light emitting element 107 is determined by a potential difference between the power source line 101 and the power source connected to the terminal 108 in a case where the driving transistor 106 operates in a liner region. Further, in a case where the driving transistor 106 operates in a saturation region, the luminance is slightly lowered because the current value that is supplied to the light emitting element 107 is determined by the driving transistor 106. However, in a case of a digital driving method, variation in the luminance is seldom recognized because the operation of the light emitting element 107 is controlled by using only two states of light emission and non-light emission.

Figure 6:
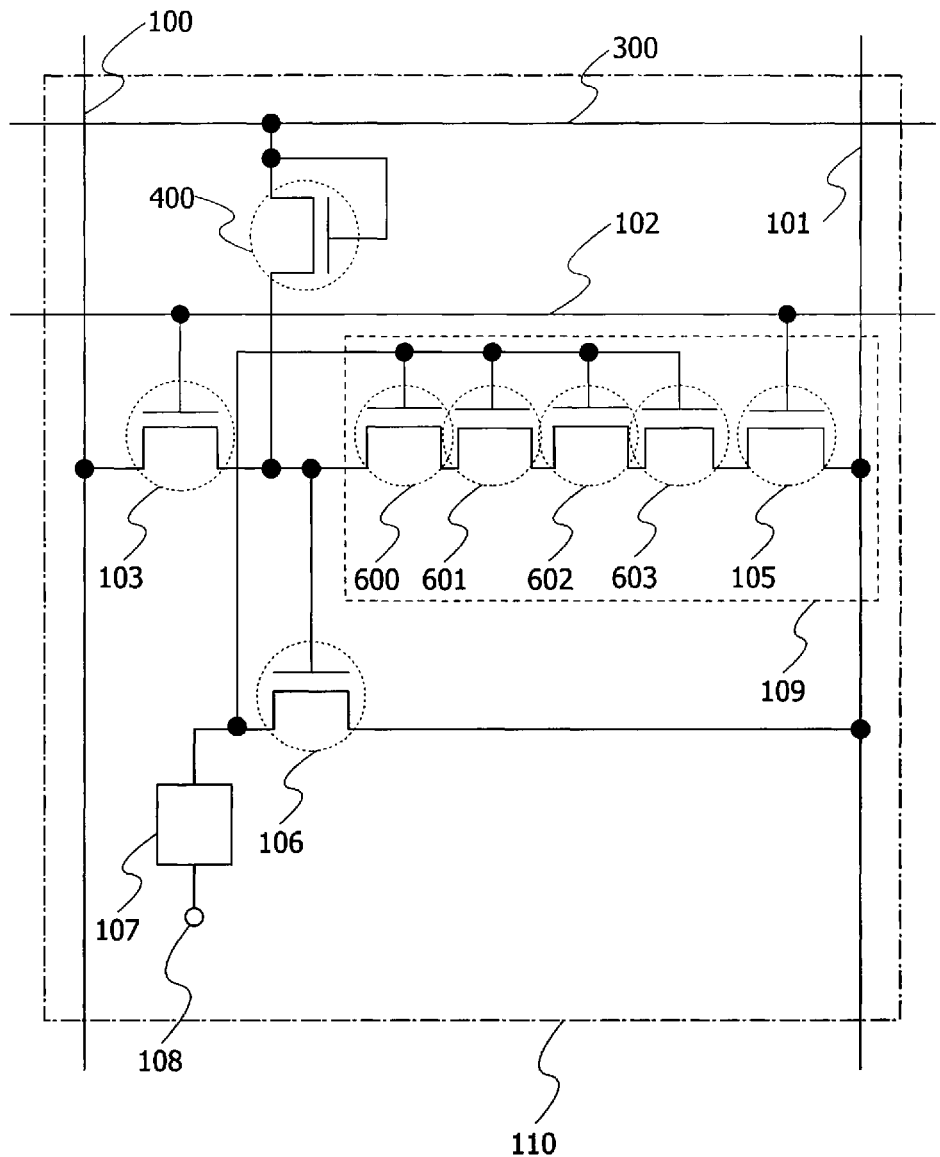
FIG. 6 is a diagram showing a configuration example of a pixel in a display device of the present invention.

It is to be noted that the transistor 104 included in the compensation circuit 109 may be replaced with transistors 600 to 603 that are connected in series (see FIG. 6). In other words, the transistor 104 may be replaced with a transistor having a plurality of gate electrodes that are connected to each other (also called a transistor of a multi-gate structure). A leakage current can be reduced by using the transistor having a plurality of gate electrodes that are connected to each other.

(Embodiment Mode 2)

Figure 3A:
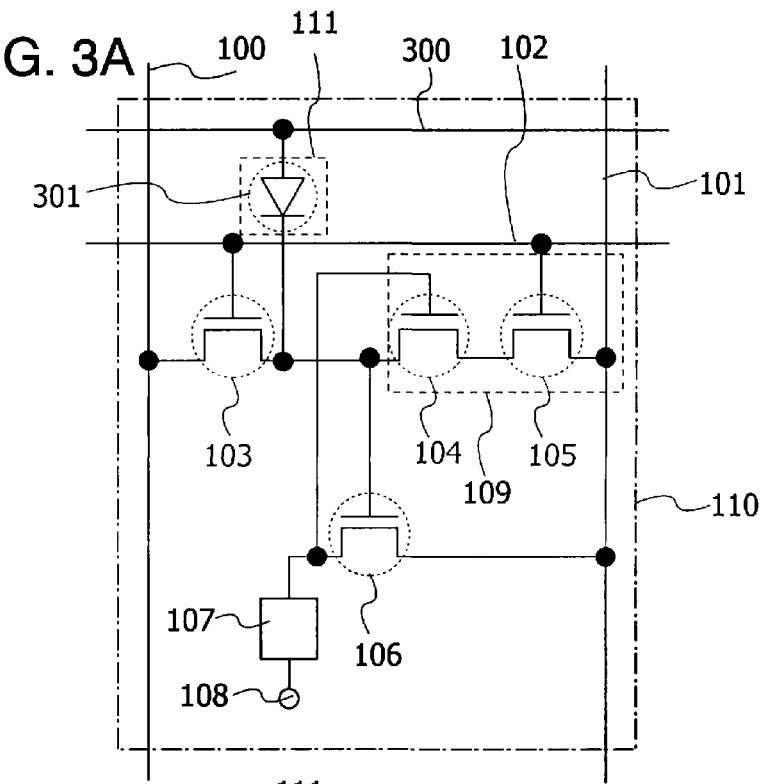
FIGS. 3A and 3B are diagrams showing a configuration example of a pixel in a display device of the present invention.

In a case of displaying multi-gray scales by a method in which a digital driving method and a time gray scale method are combined, a light emitting period is required to be controlled more minutely. Therefore, operation in which a predetermined pixel is forcibly made to be in a non-lighting state by a control signal is required. In the present embodiment mode, an example where the present invention is applied to a pixel having a function that forcibly makes a non-lighting state will be described with reference to FIG. 3A and FIG. 4A.

A pixel 110 includes a writing transistor 103, a driving transistor 106, a light emitting element 107, a compensation circuit 109 that controls conduction between a gate electrode of the driving transistor 106 and a power source line 101, and a controlling element 111 that controls conduction between the gate electrode of the driving transistor 106 and a scanning line 300. The compensation circuit 109 includes a transistor 104 and a transistor 105. Further, the controlling element 111 is a diode 301.

Figure 4A:
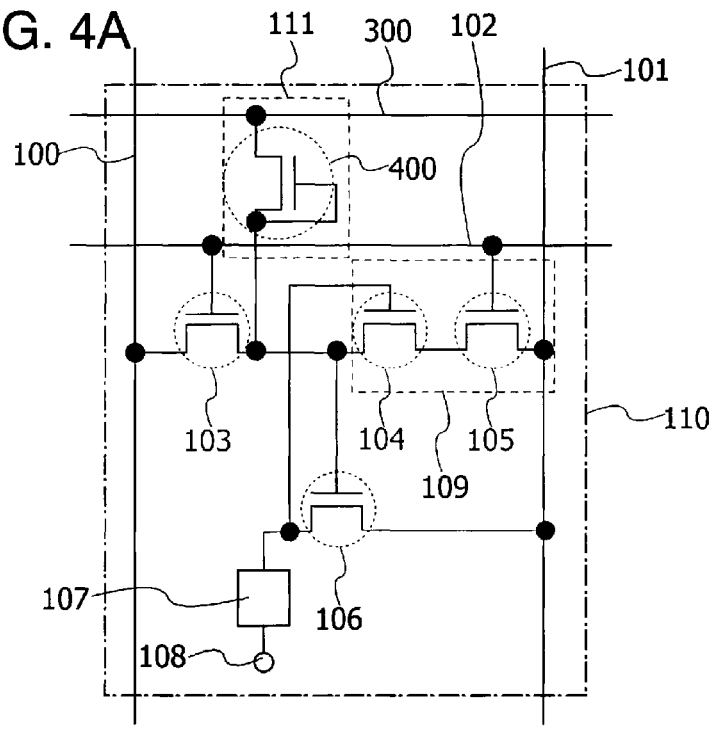
FIGS. 4A and 4B are diagrams showing a configuration example of a pixel in a display device of the present invention.

It is to be noted that the controlling element 111 may be a transistor 400 having a rectification effect, which connects a gate electrode and a drain electrode (it may be denoted as a diode-connected transistor 400 as well) (see FIG. 4A). The transistor 400 can be easily formed by the same process as other transistors included in the pixel 110. It is to be noted that the controlling element 111 can employ any structure as far as it is an element having a rectification effect. Further, as described above, in the case of using the transistor 400, a position of the drain electrode is different depending on whether its polarity is an N-channel type or a P-channel type; therefore, a connection is appropriately changed depending on the polarity.

A connection of a scanning line 102, a signal line 100, the writing transistor 103, the driving transistor 106, the power source line 101, the light emitting element 107, the transistor 104, and the transistor 105 is the same as described in Embodiment Mode 1; therefore, its description is omitted here. In the diode 301, a first electrode (one of terminals) is connected to the scanning line 300, and a second electrode (the other terminal) is connected to the gate electrode of the driving transistor 106 (see FIGS. 3A and 3B). In the diode-connected transistor 400, a source electrode; and gate and drain electrodes are connected to the scanning line 300; and the gate electrode of the driving transistor 106, respectively (see FIGS. 4A and 4B). A potential of the scanning line 300 is held to turn off the driving transistor 106.

Next, operation of the pixel 110 is described. It is to be noted that the writing transistor 103 is to be an N-channel transistor, and each of the driving transistor 106, the transistor 104, the transistor 105, and the transistor 400 is to be a P-channel transistor as an example. Further, as a potential of the power source line 101 to be a standard, each potential of the signal line 100, the scanning line 102, and the scanning line 300 is determined. In the signal line 100, a potential of a H level (high potential) side of a video signal is higher than that of the power source line 101, and a potential of a L level (low potential) side is a potential that certainly turns on the driving transistor 106 (for example, 0V in this case). In the scanning line 102, a potential of a H level (high potential) side is higher than that of the signal line 100 and a potential that certainly turns on the writing transistor 103, and a potential of a L level (low potential) side is lower than that of the signal line 100 and a potential that certainly turns off the writing transistor 103. In the scanning line 300, a potential of a H level (high potential) side of a signal is higher than that of the signal line 100, and a potential of a L level (low potential) side is lower than that of the signal line 100. It is to be noted that polarity of the above transistors and each power source potential add no limitation to the present invention. It is easy for those skilled in the art to configure an equivalent circuit by adding modification to polarity of a transistor and each power source potential in accordance with an art concept of the present invention, and it is clear that theses structures are also included in the present invention.

Operation of inputting a video signal into the pixel 110 and operation of lighting and non-lighting of the pixel 110 based on the video signal are the same as the description in Embodiment Mode 1, and thus, the description thereof is omitted here.

Next, operation in a case where the pixel 110 is forcibly made to be in a non-lighting state is described.

When writing operation of the video signal to the pixel 110 is finished, the gate electrode of the driving transistor 106 is held at a low potential in a case of making the light emitting element 107 emit light. Alternatively, in a case of making the light emitting element 107 emit no light, the gate electrode of the driving transistor 106 is held at a high potential.

Here, the scanning line 300 is selected by a gate driver at a timing in which the pixel 110 is required to be forcibly in a non-lighting state, and then, the scanning line 300 is held at a high potential. Therefore, the controlling element 111 (the diode 301 or the transistor 400) is to be in a conduction state, and a potential of the gate electrode of the driving transistor 106 becomes higher. More properly, the potential of the gate electrode of the driving transistor 106 becomes a potential that is lower than the potential of the high potential side of the scanning line 300 by a value of a threshold voltage of the diode 301. By this operation, the driving transistor 106 is turned off, and current that is supplied to the light emitting element 107 is blocked. As a result, a potential of the first electrode of the light emitting element 107 is decreased immediately to a potential that is about the same as that of a power source connected to a terminal 108, and the transistor 104 is turned on. In addition, the transistor 105 is turned on. Even after the potential of the scanning line 300 becomes lower, a potential of the power source line 101 is applied to the gate electrode of the driving transistor 106 through the transistor 104 and the transistor 105. Therefore, the driving transistor 106 is held to be turned off. By above operation, the pixel 110 that is once forcibly made to be in a non-lighting state keeps on the state of non-lighting unless a next video signal is written.

As described above, in the present invention, the controlling element 111 (the diode 301 or the transistor 400) is made to be in a conduction state at the timing in which the pixel 110 is forcibly made to be in a non-lighting state. Then, the potential of the scanning line 300 is transmitted to the gate electrode of the driving transistor 106, and the driving transistor 106 is turned off. By transmitting the potential of the scanning line 300 in such a manner, the driving transistor 106 is turned off; however, there is a possibility that variation in a potential is caused in the gate electrode of the driving the transistor 106 in this situation. Therefore, in the present invention, by making the compensation circuit 109 to be in a conduction state, the gate electrode of the driving transistor 106 and the power source line 101 are made to be in a conduction state. Then, the potential of the power source line 101 is transmitted to the gate electrode of the driving transistor 106. Accordingly, variation in a potential of the gate electrode of the driving transistor 106 can be prevented, and the driving transistor 106 can be certainly turned off.

The scanning line 300 is selected to be held at a high potential, and the controlling element 111 (the diode 301 or the transistor 400) is made to be in a conduction state. Then, after the potential of the scanning line 300 is transmitted to the gate electrode of the driving transistor 106 through the controlling element 111 (the diode 301 or the transistor 400), the driving transistor 106 is turned off and the light emitting element 107 emits no light. Thereafter, a potential of the first electrode of the light emitting element 107 is decreased immediately to a potential that is about the same as that of the power source connected to the terminal 108, and the transistor 104 is turned on.

On the other hand, since the transistor 105 is turned on, a penetration path is caused between the scanning line 300 and the power source line 101 through the transistors 104 and 105 and the controlling element 111. In this case, if a potential in a case where the scanning line 300 is held at a high potential is the same as a potential of the power source 101, there is no problem. However, if there is a potential difference between the two wirings, current flows.

Figure 3B:
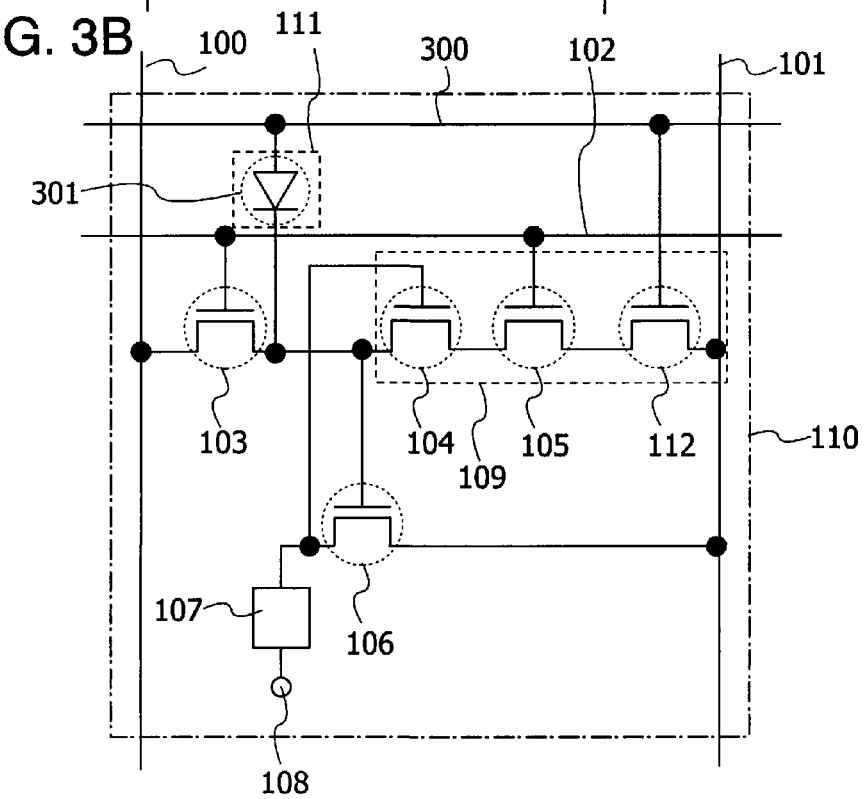
Figure 4B:
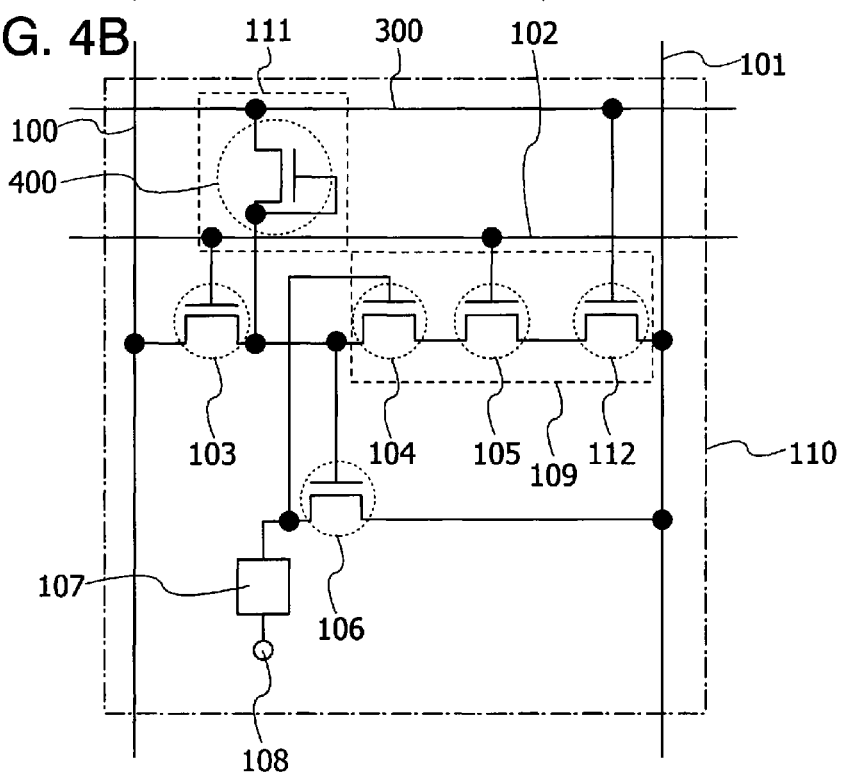

Thus, by providing a transistor 112 as shown in FIG. 3B and FIG. 4B, a structure in which the transistor 112 is turned off to block a path of the penetration when the scanning line 300 is held at a high potential may be employed. A position where the transistor 112 is arranged is not particularly limited as far as the penetration path can be blocked. For example, the transistor 112 may be provided between the transistor 104 and the transistor 105. Further, the transistor 112 may be provided between one terminal of the controlling element 111 and the transistor 104. The transistor 112 is a transistor having polarity such that the transistor is turned off by a signal transmitted from the scanning line 300 when the controlling element 111 is in a conduction state by the signal transmitted form the scanning line 300.

In order to hold the potential of the gate electrode of the driving transistor 106 during the period of the lighting of the pixel 110, it is preferable to make a leakage current of the transistor 104 smaller than that of the diode 301 or the transistor 400. Therefore, the transistor 104 may be replaced with the transistors 600 to 603 connected in series (see FIG. 6). In other words, the transistor 104 may be replaced with a transistor having a plurality of gate electrodes that are connected to each other. A leakage current can be further reduced, by using the transistor having a plurality of gate electrodes that are connected to each other.

(Embodiment Mode 3)

Figure 5:
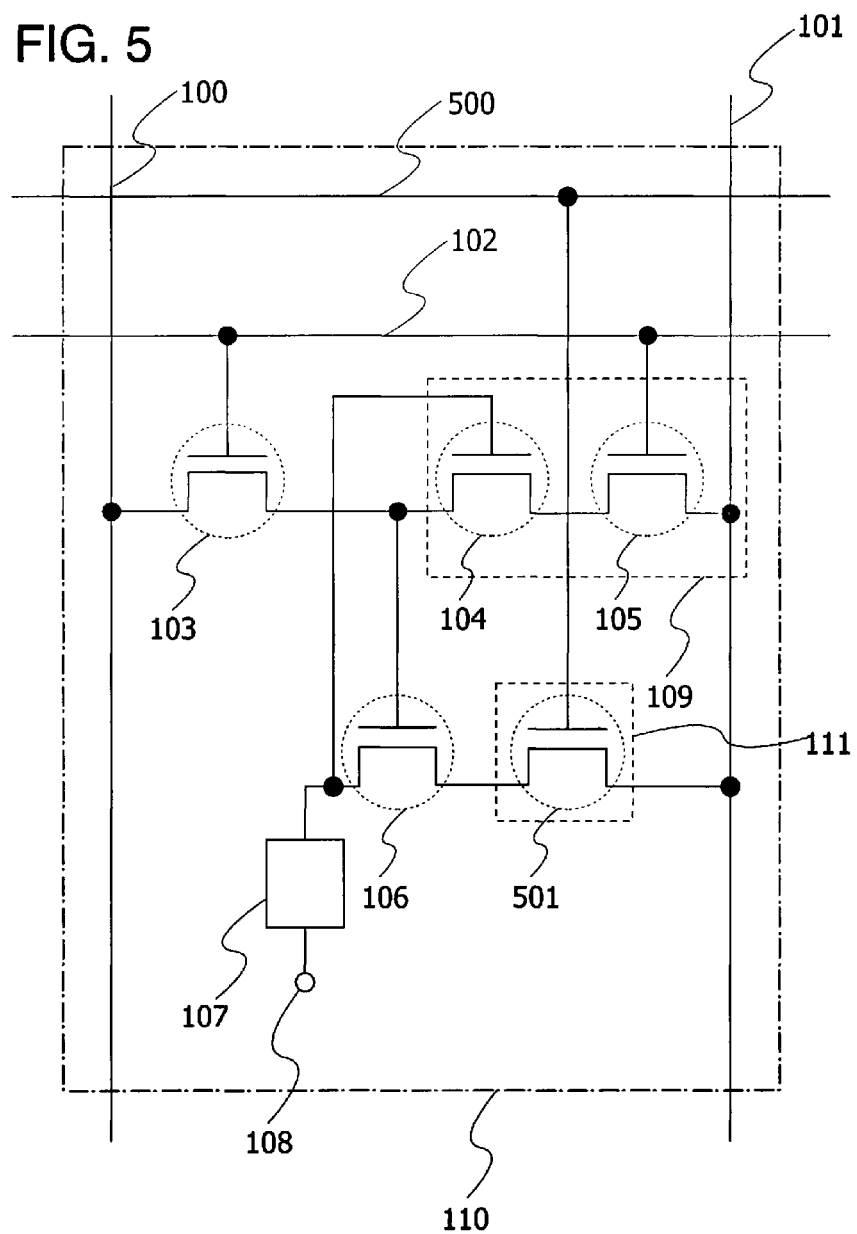
FIG. 5 is a diagram showing a configuration example of a pixel in a display device of the present invention.

An example in which the present invention is applied to a pixel 110 having a function that forcibly makes a non-lighting state will be described with reference to FIG. 5.

The pixel 110 includes a writing transistor 103, a driving transistor 106, a power source line 101, a light emitting element 107, a compensation circuit 109 that controls conduction between a gate electrode of the driving transistor 106 and the power source line 101, and a controlling element 111 that controls conduction between a first electrode of the driving transistor 106 and the power source line 101. The compensation circuit 109 includes a transistor 104 and a transistor 105. The controlling element 111 is a transistor 501.

A connection of a scanning line 102, a signal line 100 to which a video signal is inputted, the writing transistor 103, the driving transistor 106, the power source line 101, the light emitting element 107, the transistor 104, and the transistor 105 is the same as the description in Embodiment Mode 1; therefore the description thereof is omitted. The transistor 501 is connected between a second electrode (a source electrode or a drain electrode) of the driving transistor 106 and the power source line 101 in series, and a gate electrode thereof is connected to a scanning line 500.

Next, operation of the pixel 110 is described. In order to the description of the operation clear, as an example, the writing transistor 103 is to be an N-channel transistor, and each of the driving transistor 106, the transistor 104, the transistor 105, and the transistor 501 is to be a P-channel transistor. Further, as the potential of the source line 101 to be a standard, each potential of a signal line 100 and the scanning lines 102 and 500 is determined. In the signal line 100, a potential of a H level (high potential) side of a video signal is higher than that of the power source line 101, and a potential of a L level (low potential) side is a potential that certainly turns on the driving transistor 106 (for example, 0V in this case). In the scanning line 102, a potential of a H level (high potential) side of a signal is higher than that of the signal line 100 and a potential that certainly turns on the writing transistor 103, and a potential of a L level (low potential) side is lower than that of the signal line 100 and a potential that certainly turns off the writing transistor 103. In the scanning line 500, a potential of a H level (high potential) side of a signal is higher than that of the power source line 101, and a potential of a L level (low potential) side is the same as or lower than that of the signal line 100. It is to be noted that polarity of the above transistors and each power source potential add no limitation to the present invention. It is easy for those skilled in the art to configure an equivalent circuit by adding modification to polarity of a transistor and each power source potential in accordance with an art concept of the present invention, and it is clear that theses structures are also included in the present invention.

Operation of inputting a video signal into the pixel 110 and operation of lighting and non-lighting of the pixel 110 based on the video signal is the same as the description of Embodiment Mode 1; therefore, the description thereof is omitted here.

Next, operation in the case where the pixel 110 is forcibly made to be in a non-lighting state is described.

When writing operation of the video signal to the pixel 110 is finished, the gate electrode of the driving transistor 106 is held at a low potential in a case where the light emitting layer 107 emits light and the gate electrode of the driving transistor 106 is held at a high potential in a case where the light emitting element 107 emits no light.

Here, the scanning line 500 is selected by a gate driver at a timing in which the pixel 110 is required to be forcibly in a non-lighting state, and then, the scanning line 500 is held at a high potential. Thus, the transistor 501 is turned off. By this operation, a path of current supply from the power source line 101 to the light emitting element 107 is blocked. Then, a potential of a first electrode of the light emitting element 107 is immediately decreased to a potential that is about the same as a potential of a power source connected to a terminal 108, and the transistor 104 is turned on. Further, the transistor 105 is turned on. Accordingly, a potential of the power source line 101 is transmitted to the gate electrode of the driving transistor 106, and the driving transistor 106 is turned off. Thereafter, even if the scanning line 500 is held at a low potential, the driving transistor 106 has been already turned off, and thus, current is not supplied to the light emitting element 107. By the above operation, the pixel 110 that is once forcibly made to be in a non-lighting state is kept on in the non-lighting state unless a next video signal is written.

It is to be noted that the transistor 104 may be replaced with the transistors 600 to 603 that are connected in series (see FIG. 6). In other words, the transistor 104 may be replaced with a transistor having a plurality of gate electrodes that are connected to each other (also called s transistor of a multi-gate structure). By using the transistor having a plurality of gate electrodes connected to each other, a leakage current is further reduced.

[Embodiment 1]

Figure 7:
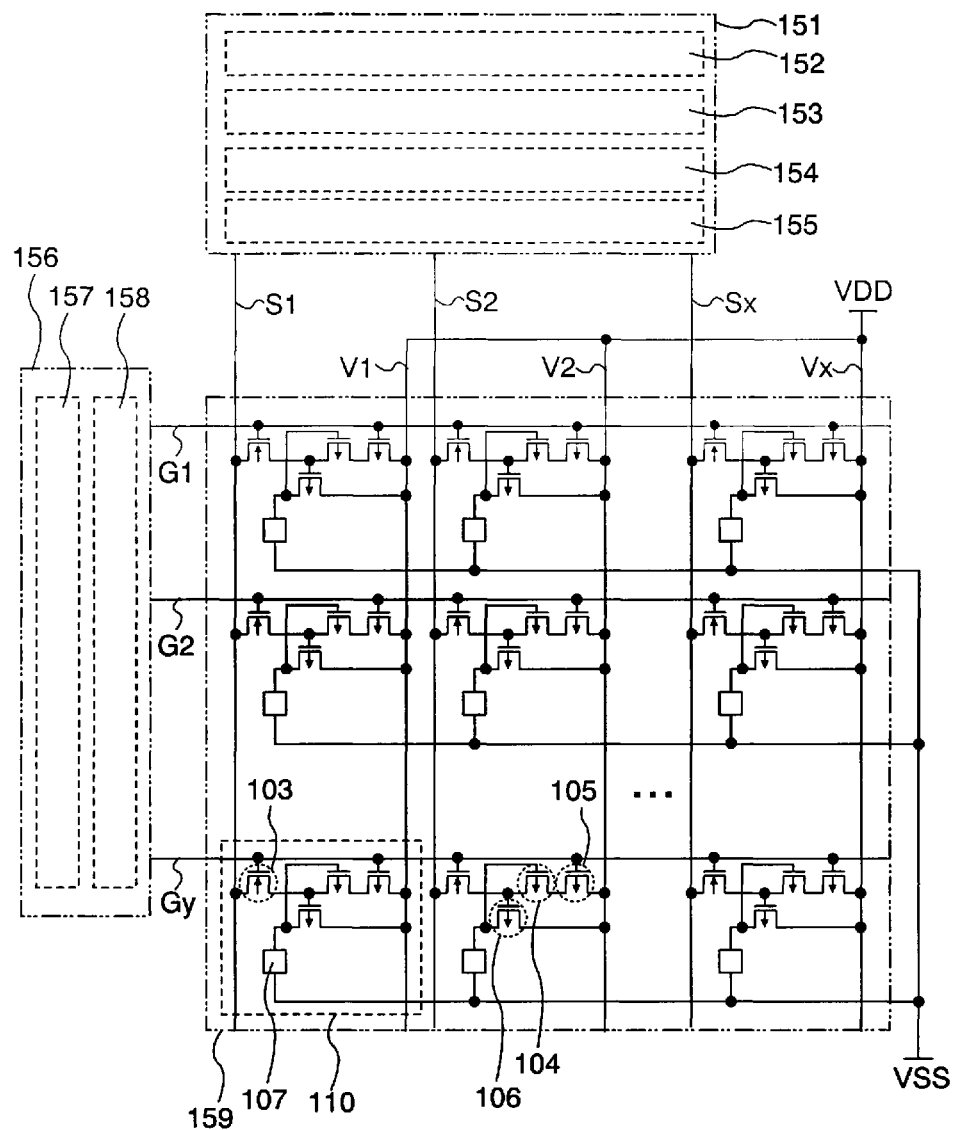
FIG. 7 is a diagram describing a display device of the present invention.
Figure 9:
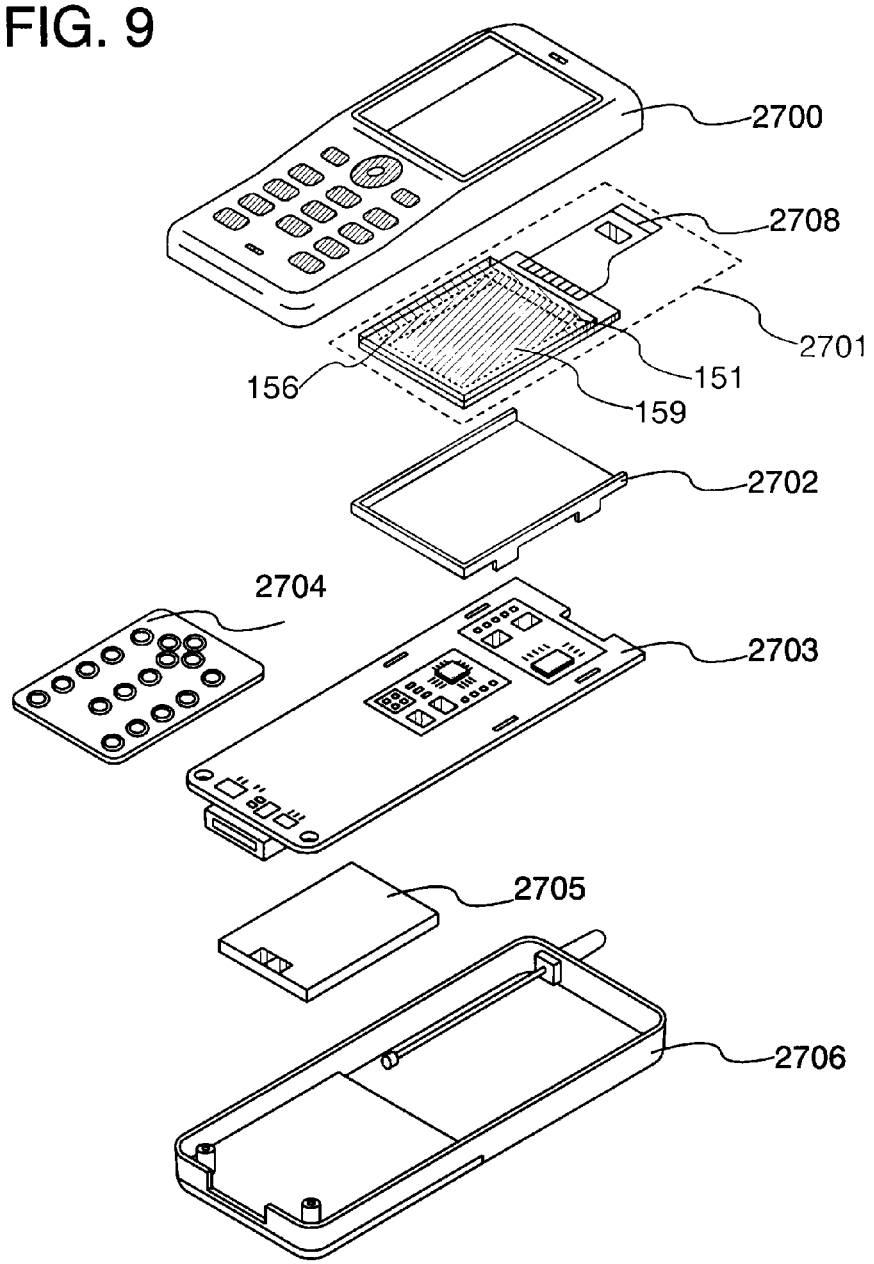
FIG. 9 is a view showing an electronic device using a display device of the present invention.
Figure 10A:
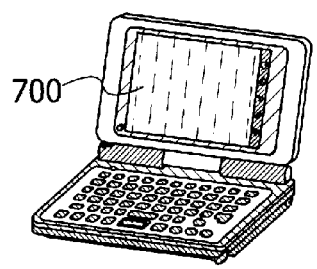
FIGS. 10A to 10E are views showing electronic devices using a display device of the present invention.
Figure 10B:
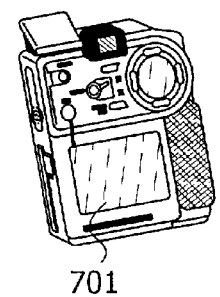
Figure 10C:
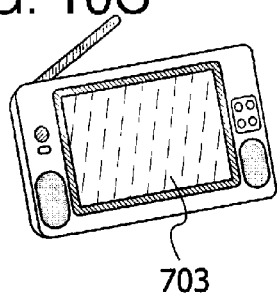
Figure 10D:
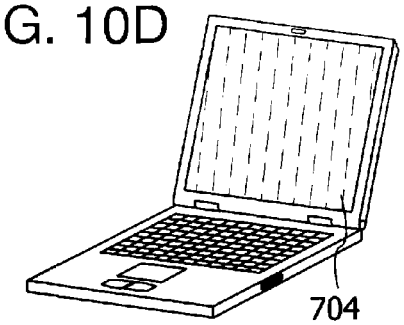
Figure 10E:
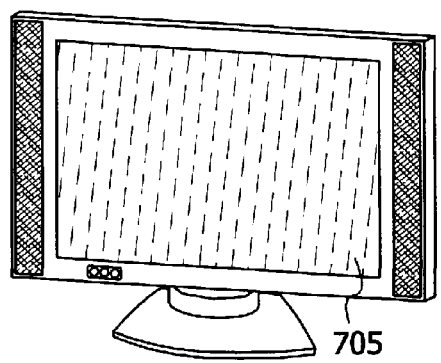

A configuration of a display device of the present invention will be described with reference to FIG. 7. A display device of the present invention includes a source driver 151, a gate driver 156, and a pixel portion 159. The source driver 151 includes a pulse output circuit 152, latch circuits 153 and 154, and a buffer circuit 155. The gate driver 156 includes a pulse output circuit 157 and a buffer circuit 158. The pulse output circuits 152 and 157 are circuits for outputting a sampling signal, for example, a shift register and a decoder. The latch circuits 153 and 154 hold a video signal and output the held video signal to a circuit in a lower stage. The buffer circuits 155 and 158 amplify the inputted signal and output the amplified signal to a circuit in the lower stage. The source driver 151 outputs a video signal to a pixel 110 through a signal line. The gate driver 156 outputs a selection signal to the pixel 110 through a scanning line.

The pixel portion 159 includes a plurality of signal lines (S1 to Sx; x is a natural number), a plurality of scanning lines (G1 to Gy; y is a natural number), a plurality of power source lines (V1 to Vx), and a plurality of pixels 110 arranged in a matrix. Each of a plurality of the pixels 110 includes a writing transistor 103, a driving transistor 106, a transistor 104, a transistor 105, and a light emitting element 107. It is to be noted that a configuration of the pixel 110 is not limited to the above structure, and any of the structures shown in FIGS. 3A and 3B, FIGS. 4A and 4B, FIG. 5, and FIG. 6 may be employed. Further, polarity of the transistors included in the pixel 110 is not particularly limited.

[Embodiment 2]

A panel that is one mode of a display device of the present invention will be described with reference to FIGS. 8A and 8B. The panel includes a source driver 151 including a plurality of elements 125, a gate driver 156, and a pixel portion 159 including a driving transistor 106 and a light emitting element 107 between a substrate 120 and a substrate 121 (see FIGS. 8A and 8B). Further, the panel also includes a connection film 122 provided over the substrate 120. The connection film 122 is connected to a plurality of IC chips. A line A-B in FIG. 8A corresponds to a line A-B in FIG. 8B. Further, a line C-D-E in FIG. 8B corresponds to a line C-D-E in FIG. 11.

A sealing material 123 is provided around the source driver 151, the gate driver 156, and the pixel portion 159. The light emitting element 107 is sealed by the sealing material 123, the substrate 120, and the substrate 121. A sealing process is a process for protecting the light emitting element 107 from moisture, and here, a method of sealing with a cover material (glass, ceramics, plastics, metal, or the like) is used. However, a method of sealing with a thermosetting resin or an ultraviolet curable resin, or a method of sealing with a thin film that has a high barrier ability such as metal oxide, nitride, or the like.

When a pixel electrode (a first electrode) 160 of the light emitting element 107 has a light transmitting property and an opposed electrode (a second electrode) 161 of the light emitting element 107 has a light shielding property, the light emitting element 107 performs bottom emission (see FIG. 8B). When the pixel electrode 160 of the light emitting element 107 has a light shielding property and the opposed electrode 161 of the light emitting element 107 has a light transmitting property, the light emitting element 107 performs top emission. In addition, when both the pixel electrode 160 and the opposed electrode 161 of the light emitting element 107 have a light transporting property, the light emitting element 107 performs dual emission. The bottom emission indicates that the light emitting element 107 emits light toward the substrate 120. The top emission indicates that the light emitting element 107 emits light toward the substrate 121. The dual faces emission indicates that the light emitting element 107 emits light toward both of the substrate 120 and the substrate 121.

The light emitting element 107 includes a layer including an electroluminescent material (hereinafter, abbreviated as an electroluminescent layer 162), in which luminescence generated by applying an electric field can be obtained, between the pixel electrode 160 and the opposed electrode 161. The electroluminescent layer 162 is formed by a single layer or plural layers. In these layers, an inorganic compound may also be contained. The luminescence in the electroluminescent layer 162 includes one or both of light emission (fluorescence) in a case of returning from a singlet excitation state to a ground state and light emission (phosphorescence) in a case of returning from a triplet excitation state to a ground state.

It is preferable that an element provided over the substrate 120 be formed by a thin film transistor, which has a crystalline semiconductor with favorable characteristics such as mobility, as a channel portion. Thus, the number of external ICs that are connected can be decreased. Therefore, reduction in size, weight, and thickness of the element can be achieved.

Further, an element provided over the substrate 120 may be formed by a transistor that has an amorphous semiconductor as a channel portion, and the source driver 151 and the gate driver 156 may be formed by an IC chip. The IC chip is attached over the substrate 120 or is attached to the connection film 122 by a COG method. The amorphous semiconductor can be easily formed over a large-area substrate by using a CVD method. In addition, since a crystallization process is not necessary, an inexpensive panel can be provided. In this case, when a conductive layer is formed by a droplet discharging method typified by inkjet, a more inexpensive panel can be provided.

[Embodiment 3]

Modes of electronic devices using a display device of the present invention will be described with reference to FIG. 9 and FIGS. 10A to 10E. An electronic device illustrated here is a cellular phone set, which includes frame bodies 2700 and 2706, a panel 2701, a housing 2702, a printed wiring board 2703, operation buttons 2704, and a battery 2705 (see FIG. 9). The panel 2701 includes a source driver 151, a gate driver 156, and a pixel portion 159, and these circuits are sealed with a pair of substrates. The panel 2701 is incorporated into the housing 2702 so as to be attached and detached freely, and the housing 2702 is fitted into the printed wiring board 2703. A shape and a size of the housing 2702 are appropriately changed depending on an electronic device into which the panel 2701 is incorporated. A plurality of IC chips that correspond to one or a plurality of circuits selected from a central processing unit (CPU), a controller circuit, a power source circuit, and the like, are mounted in the printed wiring board 2703.

The panel 2701 is connected to the printed wiring board 2703 through a connection film 2708. A state in which the printed wiring board 2703 is mounted into the panel 2701 is called a module. The panel 2701, the housing 2702, and the printed wiring board 2703 are stored inside the frame bodies 2700 and 2706 with the operating buttons 2704 and the battery 2705. A pixel portion included in the panel 2701 is arranged so as to be visible from an opening window provided in the frame body 2700.

It is to be noted that the frame bodies 2700 and 2706 are shown as an example of an outward appearance shape of the cellular phone set, and an electronic device according to the present embodiment can be changed into various modes in accordance with a function and usage thereof. Therefore, examples of a mode of an electronic device will be described with reference to FIGS. 10A to 10E below. For example, a camera such as a digital camera and a video camera, a portable game machine, a monitor, a computer, an audio reproducing device such as a car audio, an image reproducing device provided with a recording medium such as a home game machine, a portable information terminal such as a PDA (see FIG. 10A), a digital video camera (see FIG. 10B), a portable television set (see FIG. 10C), a notebook computer (see FIG. 10D), a television set (a television or a television receiver, see FIG. 10E), and the like can be given. A display device of the present invention is applied to display portions 700 to 705 of these electronic devices. By suppressing variation in a potential of a gate electrode of a driving transistor, a light emitting element can be more precisely controlled to emit light or no light in a display device. Accordingly, an electronic device in which generation of a display defect is suppressed can be provided by using a display device of the present invention.

[Embodiment 4]

Figure 11:
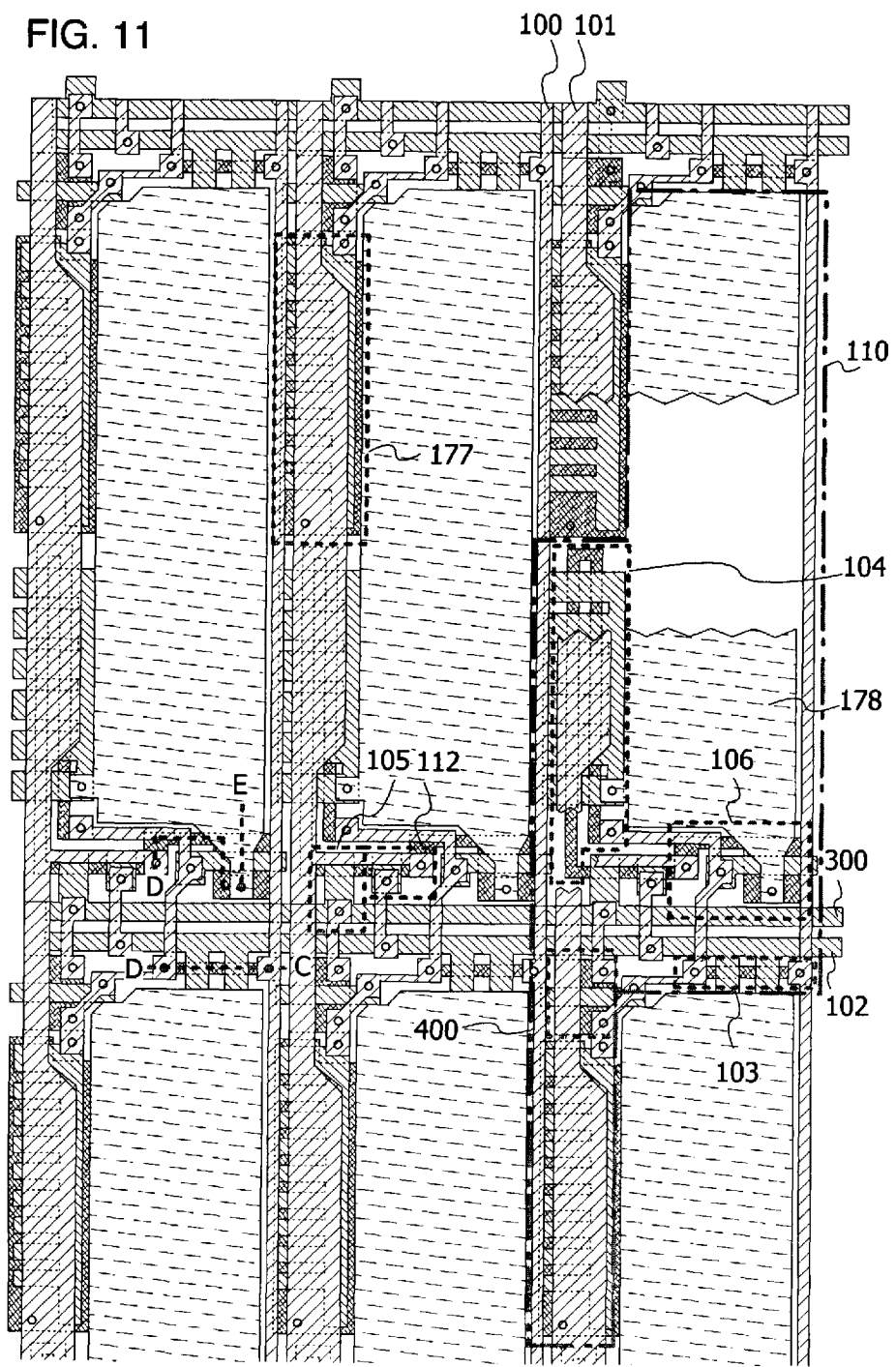
FIG. 11 is a view showing a layout of a pixel.

A layout view of a pixel in a display device of the present invention will be described with reference to FIG. 11. The layout view of a pixel 110 shown in FIG. 11 corresponds to the equivalent circuit diagram in FIG. 4B. Control of the pixel 110 is performed by a signal and a potential transmitted from each wiring of a scanning line 102, a scanning line 300, a signal line 100, and a power source line 101. Further, the pixel 110 includes a writing transistor 103, a transistor 104, a transistor 105, a driving transistor 106, a transistor 400, and a transistor 112. Although it is not shown in the equivalent circuit diagram in FIG. 4B, the pixel 110 includes a capacitor 177. One of electrodes of the capacitor 177 is connected to a gate electrode of the driving transistor 106, and the other electrode is connected to the power source line 101. In addition, in the layout view shown in FIG. 11, a pixel electrode 178 of a light emitting element 107 included in the pixel 110 is illustrated. Further, in the layout shown in FIG. 11, the writing transistor 103 is a transistor including two gate electrodes that are connected to each other, and the transistor 104 is a transistor including a plurality of gate electrodes that are connected to each other.

This application is based on Japanese Patent Application serial no. 2005-118813 filed in Japan Patent Office on Apr. 15, in 2005, the entire contents of which are hereby incorporated by reference.

What is claimed is:

1. A display device comprising:
a first transistor;
a second transistor;
a third transistor;
a fourth transistor,
a fifth transistor; and
a pixel electrode,
wherein one of a source and a drain of the first transistor is directly connected a signal line,
wherein the other of the source and the drain of the first transistor is electrically connected to a gate of the second transistor and one of a source and a drain of the third transistor,
wherein one of a source and a drain of the second transistor is directly connected to a gate of the third transistor and the pixel electrode,
wherein the other of the source and the drain of the second transistor is directly connected to one of a source and a drain of the fifth transistor,
wherein the other of the source and the drain of the third transistor is electrically connected to one of a source and a drain of the fourth transistor,
wherein the other of the source and the drain of the fourth transistor is electrically connected to a power source line,
wherein the other of the source and the drain of the fifth transistor is electrically connected to the power source line,
wherein a gate of the first transistor and a gate of the fourth transistor are directly connected to a first scan line, and
wherein a gate of the fifth transistor is directly connected to a second scan line.

2. A display module comprising the display device according to claim 1 and a printed wiring board.

3. An electronic device comprising the display module according to claim 2 and at least one of a battery, an antenna, and an operation button.

4. A display device comprising:
a first transistor;
a second transistor;
a third transistor;
a fourth transistor,
a fifth transistor; and
a pixel electrode,
wherein one of a source and a drain of the first transistor is directly connected a signal line,
wherein the other of the source and the drain of the first transistor is electrically connected to a gate of the second transistor and one of a source and a drain of the third transistor,
wherein one of a source and a drain of the second transistor is directly connected to a gate of the third transistor and the pixel electrode,
wherein the other of the source and the drain of the second transistor is directly connected to one of a source and a drain of the fifth transistor,
wherein the other of the source and the drain of the third transistor is electrically connected to one of a source and a drain of the fourth transistor,
wherein the other of the source and the drain of the fourth transistor is electrically connected to a power source line,
wherein the other of the source and the drain of the fifth transistor is electrically connected to the power source line,
wherein a gate of the first transistor and a gate of the fourth transistor are directly connected to a first scan line,
wherein a gate of the fifth transistor is directly connected to a second scan line, and
wherein a polarity of the first transistor is different from a polarity of the fourth transistor.

5. A display module comprising the display device according to claim 4 and a printed wiring board.

6. An electronic device comprising the display module according to claim 5 and at least one of a battery, an antenna, and an operation button.

7. A display device comprising:
a first transistor;
a second transistor;
a third transistor;

a fourth transistor,
a fifth transistor; and
a light-emitting element,
wherein one of a source and a drain of the first transistor is directly connected a signal line,
wherein the other of the source and the drain of the first transistor is electrically connected to a gate of the second transistor and one of a source and a drain of the third transistor,
wherein one of a source and a drain of the second transistor is directly connected to a gate of the third transistor and a pixel electrode of the light-emitting element,
wherein the other of the source and the drain of the second transistor is directly connected to one of a source and a drain of the fifth transistor,
wherein the other of the source and the drain of the third transistor is electrically connected to one of a source and a drain of the fourth transistor,
wherein the other of the source and the drain of the fourth transistor is electrically connected to a power source line,
wherein the other of the source and the drain of the fifth transistor is electrically connected to the power source line,
wherein a gate of the first transistor and a gate of the fourth transistor are directly connected to a first scan line, and
wherein a gate of the fifth transistor is directly connected to a second scan line.

8. The display device according to claim 7, wherein the light-emitting element comprises a light-emitting layer and a second electrode.

9. A display module comprising the display device according to claim 7 and a printed wiring board.

10. An electronic device comprising the display module according to claim 9 and at least one of a battery, an antenna, and an operation button.

11. The display device according to claim 1, wherein the gate of the second transistor is not electrically connected to the gate of the fifth transistor.

12. The display device according to claim 1, wherein a polarity of the second transistor is the same as a polarity of the fifth transistor.

13. The display device according to claim 4, wherein a polarity of the second transistor is the same as a polarity of the fifth transistor.

14. The display device according to claim 7, wherein a polarity of the second transistor is the same as a polarity of the fifth transistor.

15. The display device according to claim 1, wherein the third transistor and the fourth transistor are configured to turn on when the fifth transistor turns off.

16. The display device according to claim 1, wherein the second transistor is configured to turn off when the third transistor and the fourth transistor turn on.

17. The display device according to claim 4, wherein the third transistor and the fourth transistor are configured to turn on when the fifth transistor turns off.

18. The display device according to claim 4, wherein the second transistor is configured to turn off when the third transistor and the fourth transistor turn on.

19. The display device according to claim 7, wherein the third transistor and the fourth transistor are configured to turn on when the fifth transistor turns off.

20. The display device according to claim 7, wherein the second transistor is configured to turn off when the third transistor and the fourth transistor turn on.

21. The display device according to claim 4, further comprising a counter electrode, wherein the second transistor is configured to turn off when a potential of the counter electrode is transmitted to the gate of the third transistor.

22. The display device according to claim 7, wherein the second transistor is configured to turn off when a potential of a counter electrode of the light-emitting element is transmitted to the gate of the third transistor.

* * * * *